US006591163B2

(12) United States Patent
Nakashima

(10) Patent No.: US 6,591,163 B2
(45) Date of Patent: Jul. 8, 2003

(54) SYSTEM, PROCESS, APPARATUS AND PROGRAM FOR CONTROLLING SPECIAL LOT CARRYING IN SEMICONDUCTOR CARRYING FACILITY

(75) Inventor: Hiroshi Nakashima, Tokyo (JP)

(73) Assignee: NEC Electronics Corporation (JP)

( * ) Notice: Subject to any disclaimer, the term of this patent is extended or adjusted under 35 U.S.C. 154(b) by 278 days.

(21) Appl. No.: 09/775,903

(22) Filed: Feb. 2, 2001

(65) Prior Publication Data
US 2001/0012970 A1 Aug. 9, 2001

(30) Foreign Application Priority Data
Feb. 4, 2000 (JP) ......................... 2000-027765

(51) Int. Cl.$^7$ ............................. G06F 19/00
(52) U.S. Cl. .................. 700/228; 700/229; 700/213; 700/215; 700/218; 414/273; 414/274
(58) Field of Search ................. 700/213, 215, 700/218, 225, 226, 228, 229; 414/273, 274

(56) References Cited

U.S. PATENT DOCUMENTS

| 5,378,145 A | * | 1/1995 | Ono et al. | 432/152 |
| 5,536,128 A | * | 7/1996 | Shimoyashiro et al. | 414/273 |
| 5,584,118 A | * | 12/1996 | Furukawa et al. | 29/701 |
| 5,696,689 A | * | 12/1997 | Okumura et al. | 700/121 |
| 6,148,246 A | * | 11/2000 | Kawazome | 700/121 |

FOREIGN PATENT DOCUMENTS

| GB | 2 351 161 A | 12/2000 | H01L/21/00 |
| JP | 7-85154 | 3/1995 | G06F/17/60 |
| JP | 7085154 A | * 3/1995 | G06F/17/60 |
| JP | 10-199945 | 7/1998 | H01L/21/66 |

* cited by examiner

Primary Examiner—Leo Picard
Assistant Examiner—Michael D Masinick
(74) Attorney, Agent, or Firm—Hayes Soloway P.C.

(57) ABSTRACT

A system, method, apparatus and program which enables the automation of the carrying of a lot or lots of special purpose wafers between stockers and to achieve high speed processing while suppressing an increase in storage volume. The carrying control system includes stockers for storing therein special purpose lot or lots comprising wafers which will not be processed in production facilities, or said special purpose lot or lots and usual lot or lots comprising wafers which will be processed by production facilities and a carrying host computer for controlling automatic carrying of lot or lots in carrying facilities. The carrying host computer receives a report of receipt of the special purpose lot(s) by one of stockers transmitted from the one of the stockers when the special purpose lot(s) is received by said one of the stocker in said carrying pattern, for initiating a timer and for assuming that processing of the special purpose lot(s) stored in said stocker is completed when a result of count in the timer shows lapse of a predetermined period of time, for determining a next stocker to which the special purpose lot is to be carried next in accordance with a carrying pattern corresponding to the special purpose lot(s) stored in the storage unit, and for sending to the one of the stockers which stores the special purpose lots an carrying instruction for carrying special purpose lots to next stocker.

14 Claims, 12 Drawing Sheets

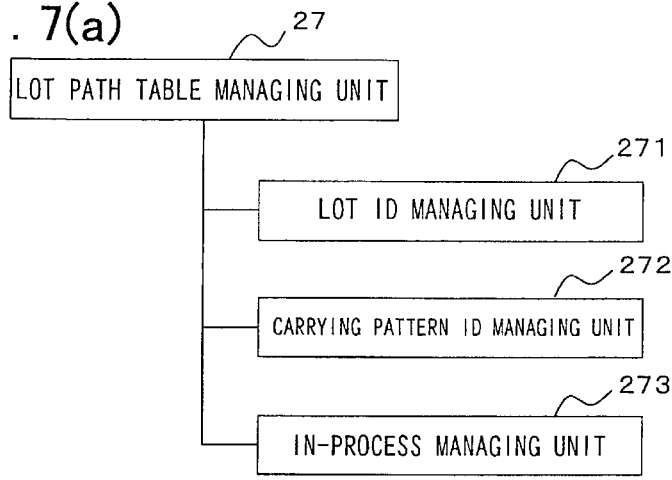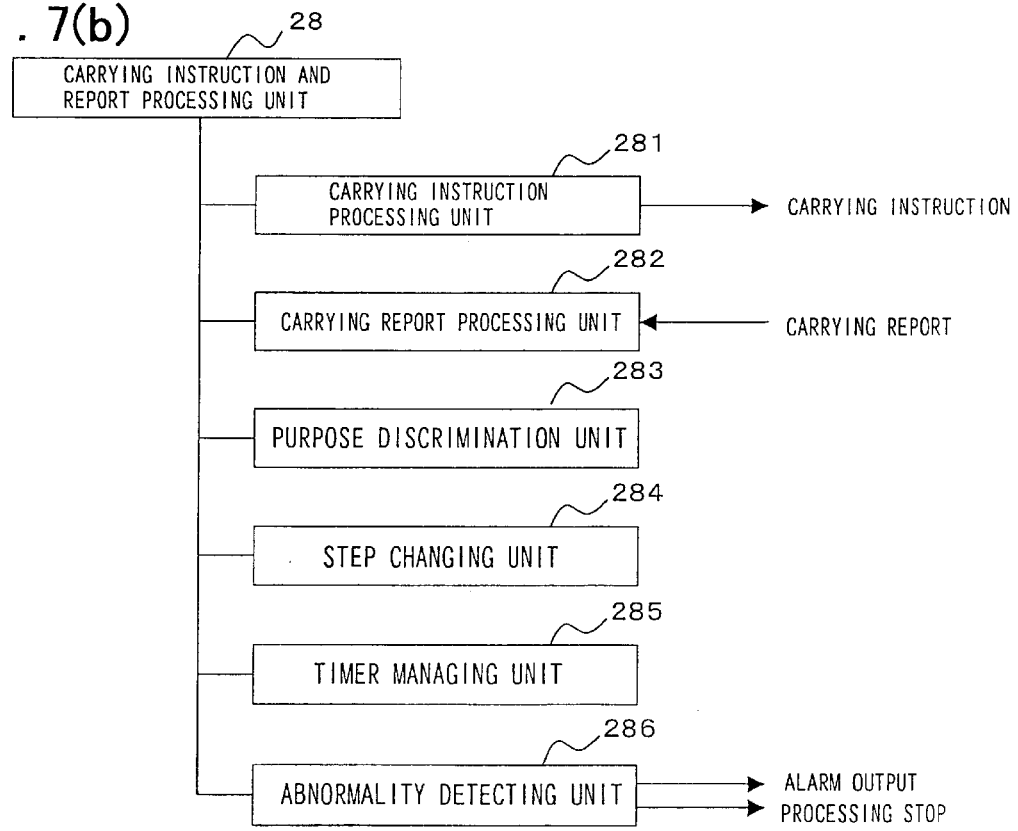

a · · · LINE
b · · · AREA
c · · · MANUFACTURING APPARATUS
d · · · STOCKER
e · · · IN-PROCESS CARRYING VEHICLE
h · · · INTEROPERATION CARRYING VEHICLE

SYSTEM, PROCESS, APPARATUS AND PROGRAM FOR CONTROLLING SPECIAL LOT CARRYING IN SEMICONDUCTOR CARRYING FACILITY

FIELD OF THE INVENTION

The present invention relates to a lot managing technique in semiconductor device carrying facilities; and in particular to a system, process, apparatus and recording medium for achieving an automation of the carrying of, for example, a lot of special purpose wafers used for monitoring dust, which are not processed in semiconductor manufacturing facilities.

BACKGROUND OF THE INVENTION

In association with an advance in very fine fabrication technology of semiconductor devices, the problem of foreign material such as particles (dust) has become more serious. Clean rooms of the semiconductor manufacturing factory are equipped with detecting instrument for checking the dust in an air cleaning system, air conditioning system and the air depending upon the class of required cleanness. The dust having a size of, for example, about 0.18 μm or less, which is adhered to wafers is measured by a dust measuring instrument (also referred to as "wafer foreign material inspecting instrument") relying upon light scattering method using laser light etc.

Modularization of the clean rooms in the semiconductor factory has been promoted basically for each process. Modules are usually partitioned by bays. Carrying of lots of wafers between steps (between stockers) and within a step is automatically conducted by means of inter-step (i.e., interoperation) carrying vehicle and interoperation carrying robot, respectively. FIG. 9 is a diagram schematically showing an exemplary floor in a clean room for manufacturing semiconductor devices.

Referring to FIG. 9, reference a denotes the whole of line. The whole of line is divided into areas b for each step. Each area b comprises a plurality of manufacturing apparatus c and at least one stocker or stock bin d (also referred to as "clean stocker). Carrying of a lot (one lot comprises, for example, 25 wafers) within an area b is conducted by an in step carrying robot e. The lot of wafers accommodated in a carrier is carried on a path g disposed between the stockers d by an interoperation carrying vehicle h. The interoperation carrying vehicle h is adapted to carry the lots between different areas, and takes the lots from the stocker d and moves along a path g and gives the lots to the stocker d at different area. The manufacturing apparatus (in a step is adapted to process the wafers of the lot and includes various apparatus for washing, diffusion, oxidation, exposure, developing processes, CVD (chemical vapor deposition), RIE (reactive ion etching) for different steps. The path g (also referred to as "interoperation carrying facility clean way") comprises, for example, an elevated rail way. Receiving and issuing of wafers to and from the stockers are conducted by means of lifter.

A conventional method of measuring the cleanness of the carrying facilities in a clean room includes measuring dust by carrying wafers for monitoring dust between steps. As is described in, for example, Japanese Patent Kokai Publication 10-199945, a measuring operator sets wafers for monitoring dust on a carrier, places them into a stocker together with the carrier, sequentially carries the wafers used for monitoring dust which are accommodated in the carrier between stockers, takes the carrier out from a final stocker to a wafer dust measuring instrument by a platform car for measuring the dust.

A conventional system for controlling carrying of wafers used for monitoring the dust will be described with reference to FIG. 8. Referring now to FIG. 8, the carrying control system comprises a host computer 10' for production managing, a carrying host computer 20', and stockers (stock bins) 40. An interoperation carrying vehicle 50 for carrying a carrier 52 which accommodates, for example, one lot of wafers 51 is advanced on a path (rail: g in FIG. 9) disposed between the stockers $40_1$ and $40_2$ at different areas. Interoperation carrying controllers $30_1$, $30_2$ are controllers which are provided for the stockers $40_1$, $40_2$, respectively, and are in communication with the carrying host computer 20' and host computer 10', respectively, via a network 60. The carrying host computer 20' receives and transmits necessary control data between the interoperation controllers $30_1$ and $30_2$ for controlling automatic carrying of wafer lot from the stocker $40_1$ to the stocker $40_2$ (between steps).

FIG. 10 is a diagram showing an exemplary configuration of the database which the host computer 10' and the carrying host computer 20' include. Referring to FIG. 10, the host computer 10 includes a lot table 11 which manages the processing conditions and the advance of each lot for registering its purpose in relation to the lot ID. The lot table 11 is a table which is a list of all lots registered in the host. Registration of lots is conducted by a managing operator. The lot IDs and the purposes (applications) of lots are registered in the lot table 11.

The carrying host computer 20' is adapted to coordinate the carrying of lots and to instruct to carry the lots to the stocker 40 and includes a storage lot table 21 which is a list of lots stored in the stocker 40. The storage lot table 21 includes the lot ID and the purpose of the lot stored in the stocker as one entry. The storage lot table 21 is a table which is a list of the lots stored in the stocker. The carrying host computer 20' automatically updates its contents at will in response to a report from the stocker (receipt/issue notification information).

The stockers 40 are storage warehouses each of which stores a plurality of lots to be processed and is adapted to control the receipt/issue and carrying of the lots in response to a carrying instruction from the carrying host computer 20'.

FIG. 12 is a flow chart showing the processing procedure of the conventional carrying control system.

The lots of the special purpose wafers which are not processed in the manufacturing apparatus, such as the lots of wafers used for dust monitoring are treated as special lots and are discriminated from the product lots of wafers which are processed in a wafer processing apparatus. The lot IDs and the purposes are registered in the lot table 11 of the host computer.

The special lot is received by the stocker 40 (step S20). The lot ID of the received lot is reported to the carrying host computer 10' from the stocker 40 and the stocker which stores the special lot is also reported to the carrying host computer $20_1$. The carrying host computer 20' updates the lot ID of the special lot and registers the updated lot ID in the storage lot table 21 corresponding to the stocker (step S21).

The carrying host computer 20' conducts the task control of the carrying of the lot in interest in the same timing relationship when it receives the report of the lot ID from the stocker 40.

The host computer 10' determines the purpose of the lot in interest with reference to the lot table 11 based upon the reported lot ID (step S22). At this time, the in-process stocker (i.e. next stocker to which the lot is to be carried) is determined depending upon the processing condition of the lots whatever purpose or use the lot has. Accordingly, dummy processing conditions for the special lot (not shown in FIG. 10) are preset in the lot table 11 differently from the product lot. The next step of the product lot for the current step is determined in accordance with preset processing conditions (processing pattern). In contrast to this, the dummy processing condition become in-process state for any stockers irrespectively of order of steps.

The operator selects the special lot stored in the current stocker from an operation terminal (not shown) of the carrying host computer 10' based upon the lot ID and inputs a carrying instruction for carrying the selected special lot to desired next stocker from the current stocker (step S23). Since the special lot is carried to a manufacturing apparatus in a step for processing as mentioned above, it is managed under dummy conditions and the operator can select any stocker as next in-process stocker.

The carrying host computer 20' outputs an instruction to carry the lot to relevant stocker (step S24).

The stocker 40 automatically issues specified special lot in response to a carrying instruction from the carrying host computer 20' and updates the storage lot table 21 (step S25). The issued lot is carried to the specified next stocker by an interoperation carrying vehicle (step S26) so that it is received by a stocker in interest.

If the operation reaches at a final step by repeating the above-mentioned steps 20 to 26, the lot is stored by the stocker at its step. The special lot which has reached the final step is taken out from the stocker and is carried to a dust measuring instrument by a platform car, so that the measurement on dust adhered to wafers is conducted in the dust measuring instrument.

FIG. 11 is a diagram explaining the carrying operation of a special lot from a stocker X to a stocker Y in a conventional carrying control system. The operator inputs a carrying instruction for carrying the special lot stored in the stocker X to the stocker Y by operating a terminal of the carrying host computer 10' (1). The carrying host computer 10' sends an carrying instruction to the stocker 4 in response to the carrying instruction (2). The interoperation carrying vehicle carries the lot to the stocker Y (3). When the special lot is received by the stocker Y, a carrying completion report is noticed to the carrying host computer 10' (4).

SUMMARY OF THE DISCLOSURE

However, the above-mentioned carrying control system has the problems which will be described.

A first problem is that it is necessary for the operator to manually input a carrying instruction from the operation terminal of the carrying host computer on each carrying of the special lot from the stocker, that is each interoperation carrying, resulting in that the advance in carrying of the special lot between steps is managed by the operator. As a result, the burden of the operation on the operator is high and the working efficiency is low. In particular, if the special lot is carried through a number of stockers, or is cycled through the carrying facilities (path) many times, the working burden is greater and the possibility of wrong input may increase in conventional carrying control system.

This reason is as follows: Although the special lot is managed by the storage lot table 21 of the carrying host computer 20' as is similar to the product lot on carrying between steps, that is, on receipt and issue to and from the stocker, a function to automatically advance the special lot to next step is not provided when a report of carrying completion ((4) in FIG. 11) is received from the stocker. Accordingly, it is necessary for the operator to input a carrying instruction from a terminal of the carrying host computer, whenever the special lot is carried between the steps. For example, if the special lot is carried through the stockers 1, 2, . . . 7 and 8 on a line "a" in FIG. 9, the operator has to input a carrying instruction to next stocker from the terminal (not shown) of the carrying host computer 20' whenever the special lot is received by each stocker.

If in order to solve the first problem, the system is configured to register and manage a carrying completion report which is sent to the host computer so that the report is assumed to indicate the completion of the interoperation carrying, that is, carrying between steps, when the carrying of the special lot to the stocker is completed, a second problem would occur. In other words, the carrying completion report may be registered as one step for usual product lot. As a result, a number of useless steps should be registered and managed. This results in a low utilization of storage area in efficiency a complicated control, and a longer processing time, ultimately leading to lowering of the performance.

For example, Japanese Patent Kokai Publication 07-085154 discloses a system configuration. In this configuration, a reservation of working initiation of a special lot is registered when an operator makes a reservation of working initiation by selecting a special lot from a lot file and when processing turn comes to the special lot, an interoperation carrying instruction is issued so that the special lot is taken from the stocker to a manufacturing apparatus in process and the special lot is subjected to processing by a desired manufacturing apparatus without necessity of an operator to manually carry and set the special lot to the manufacturing apparatus and/or to input processing conditions to the manufacturing apparatus, as a lot managing apparatus which automatically carries the special lot similarly to usual lot while readily registering the special lot while readily registering the special lot used for measuring pollution in a clean room and for achieving special object in a lower rank computer by eliminating the necessity of registering in a central line control computer of the lot managing apparatus. The above-mentioned Japanese Patent Kokai Publication 07-085154 discloses no detailed means and structure on how automatic carrying of the special lots between stockers (stations) can be conducted. Implementation of automatic carrying is never considered without increasing the registration items of the product lots on the host computer.

Therefore, there is much to be desired in the art in view of the above-mentioned problem. It is an object of the present invention to provide a system, process and apparatus which automates lots of special purpose wafers between stockers and a recording medium which records thereon a control program which implements the same system. The other objects, features and advantages of the present invention will readily become more apparent to those skilled in the art from the following description of the embodiments.

The above object is achieved generally by the features of claim 1.

That is there is provided a carrying control system, characterized in that a carrying pattern defining a carrying path for each of special purpose lots comprising wafers which will not be processed in production facilities is preliminarily stored in a storage unit which is accessed from a carrying host computer which manages the control of carrying facility, that the carrying host computer, which receives a report of the completion of carrying relating to the special purpose lot or lots from one of stockers when the special purpose lot or lots are received by the one of the stockers, is adapted to advance the carrying step of the special purpose lot or lots and in accordance with a carrying pattern to determine a next stocker corresponding to the special purpose with reference to the storage unit so that it sends an instruction to carry the special purpose lot or lots to the one of the stockers, and that the special purpose lot or lots are automatically carried from a stocker constituting a starting point of the carrying pattern which is preliminarily defined for the special purpose lot or lots to a stocker constituting a final point of the carrying pattern.

In one aspect of the present invention, there is provided a carrying control system carrying comprising:

stockers for storing therein special purpose lots comprising wafers which will not be processed in production facilities, or the special purpose lots and usual lots comprising wafers which will be processed by production facilities and a carrying host computer for controlling automatic carrying of lots in carrying facilities, in which the carrying host computer comprises a storage unit for registering carrying patterns which define a carrying path or paths for special purpose lots, the computer receives a report of receipt of the special purpose lot or lots by the one of stockers transmitted from the one of the stockers when the special purpose lot or lots are received by the one of the stocker in the carrying pattern, initiating a counting means and assuming that processing of the special purpose lot or lots stored in the stocker are completed when a result of count in the counting means shows the lapse of a predetermined period of time, determining next stocker to which the special purpose lot or lots are to be carried next in accordance with the carrying pattern corresponding to the special purpose lot or lots stored in the storage unit, and sending to the one of the stockers which stores the special purpose lot or lots a carrying instruction for carrying special purpose lot or lots to a next stocker.

In a further aspect of the present invention, there is provided a process for controlling the carrying of special purpose lots. The process comprises the steps of:

preliminarily storing a carrying path for each of special purpose lots comprising wafers which will not be processed in production facilities in a storage unit which is accessed from a carrying host computer which manages the control of carrying facilities, receiving a report of completion of carrying relating to the special purpose lot or lots from one of stockers when the special purpose lot or lots are received by the one of the stockers, initiating a timer and assuming that processing of the special purpose lot or lots stored in the stocker are completed upon the lapse of a predetermined period of time after the receipt of the special purpose lot or lots by one of the stockers, determining a next stocker in accordance with a carrying pattern corresponding to the special purpose with reference to the storage unit so that it sends an instruction to carry the special purpose lot or lots to the one of the stockers, and automatically carrying special purpose lot or lots from a stocker constituting an starting point of the carrying pattern which is preliminarily defined for the special purpose lot or lots to a stocker constituting a final point of the carrying pattern.

In a carrying control apparatus for controlling automatic carrying of lots among stockers which store special purpose lot comprising wafers which are not processed in production facilities or lots comprising the special purpose lot or lots and a lot or lots of wafers which are processed in production facilities, a program product to cause a computer constituting the carrying control to execute the operations of:

(a) initiating a timer in response to a report of receipt of the special purpose lot or lots which are received by one of the stockers when the one of the stockers receives the special purpose lot or lots;

(b) determining a step to which the special purpose lot or lots are to be carried in accordance with a carrying pattern corresponding to the special purpose lot, stored in a storage by assuming that processing of the special purpose lot or lots of the lots received by the stocker is completed based upon a result of counting in the timer when a predetermined period of time has lapsed since the special purpose lot or lots are received by the one of the stockers; and (c) sending to the stocker which stores the special purpose lot or lots a carrying instruction to carry the special purpose lot or lots to the determined next step.

Other aspects and/or features of the present invention are mentioned in the appended claims, the entire disclosure thereof being incorporated herein by reference thereto.

BRIEF DESCRIPTION OF THE DRAWINGS

FIGS. 7(a) and 7(b) are diagrams showing the configuration of a carrying host computer of one embodiment of the present invention.

PREFERRED EMBODIMENTS OF THE INVENTION

Modes of embodying the present invention will be described.

Figure 1:
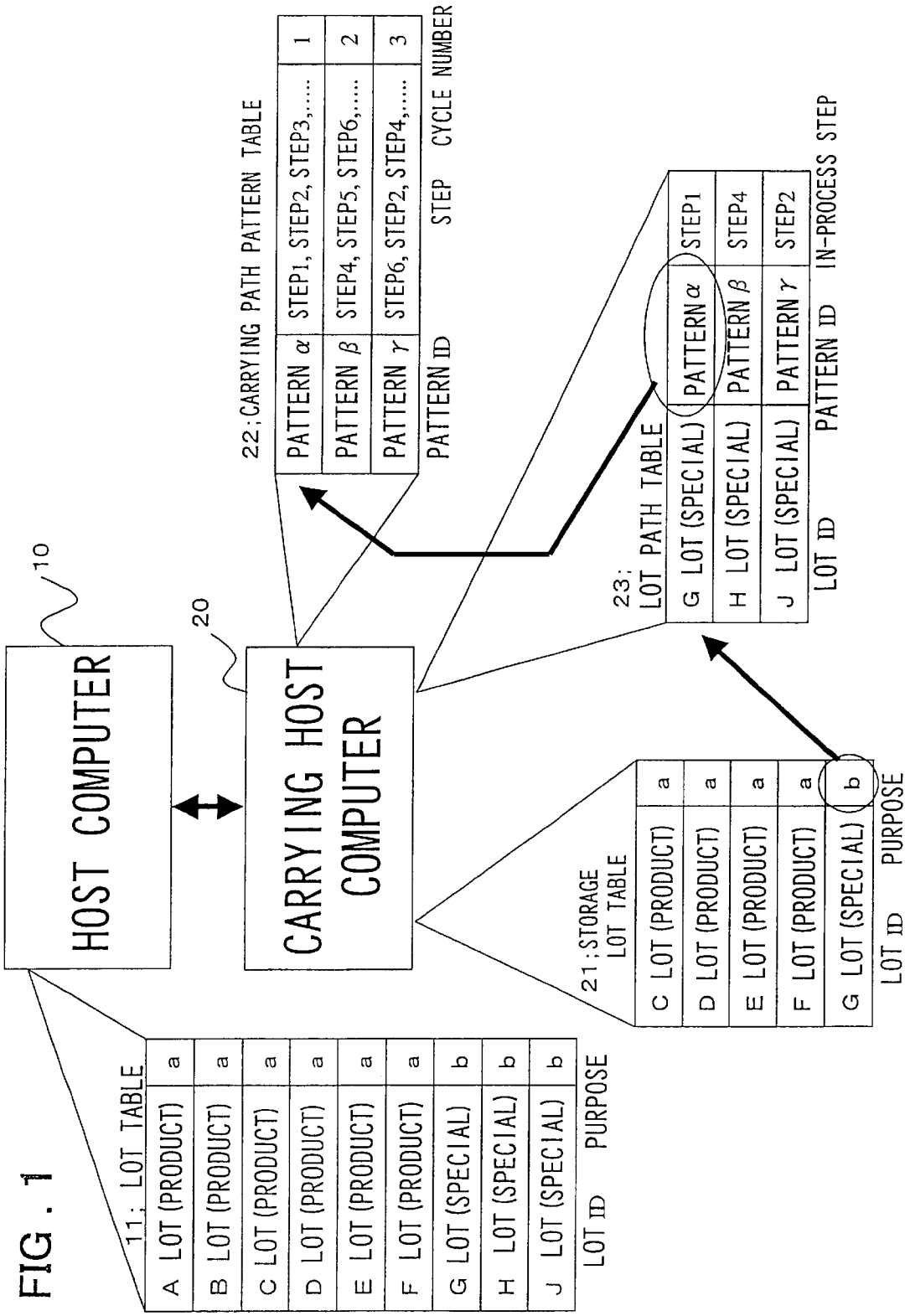
FIG. 1 is A diagram showing an example of a table configuration of a host computer and a carrying host computer in one embodiment of the present invention.

A carrying control system of the present invention is contemplated to automatically carry a lot or lots of special purpose wafers which are different in purpose from usual product lots (also referred to as "special lot or lots"), such as lots of wafers used for monitoring dust in carrying (or conveying/transporting) facilities in accordance with a carrying pattern which is preliminarily stored in a carrying host computer in a preferred mode. Referring now to FIG. 1, specifically in the mode of embodying the present invention, in a carrying control system for automatically carrying wafers on a lot by lot basis on carrying facilities laid between a plurality of steps laid between different areas by means of interoperation (i.e., inter-step) carrying means (interoperation carrying vehicle or apparatus) a carrying host computer (20) for controlling the carrying system comprises a storage unit having a carrying path pattern table (22) for registering carrying patterns comprising a series of steps (i.e., an order/line of steps) defining a carrying path or paths (referred to as "carrying steps") of the special purpose lots which will not be processed in the production facilities and pattern IDs (identification information) in a corresponding relationship thereto in addition to a storage unit lot table (21) for managing the lots stored in a stocker at each of the steps and a lot path table (23) for storing and managing the correspondence between the lot ID (identification information) of said special purpose lot (or lots) and the pattern ID, and the in-process step at in the carrying steps.

The carrying host computer (20) is supplied with (i.e., receives) a report of receipt from one of the stockers when the special purpose lot or lots is/are received by said one of the stockers on a carrying pattern and the carrying host computer initiates a timer and determines whether or not the received lot is a special purpose lot. The computer (20) determines a next step from the carrying pattern by assuming that processing at the step in interest has been completed if the received lot (or lots) is (are) a special purpose lot when the timer times out. In other words, the computer (20) acquires a pattern ID from the lot ID of said received special purpose lot (or lots) with reference to the lot path table (23) and determines the next stocker corresponding to said pattern ID by retrieving in the carrying path pattern table (22) based upon the acquired pattern ID and supplies the stocker with a carrying instruction of the special purpose lot. The stocker sends out the special purpose lot (or lots) in response to the carrying instruction from the carrying host computer (20), so that the special purpose lot (or lots) is carried to the next stocker. In such a manner, the special purpose lot (or lots) is/are automatically carried from an initial stocker to a final stocker, which are defined in accordance with the carrying pattern.

Figure 2:
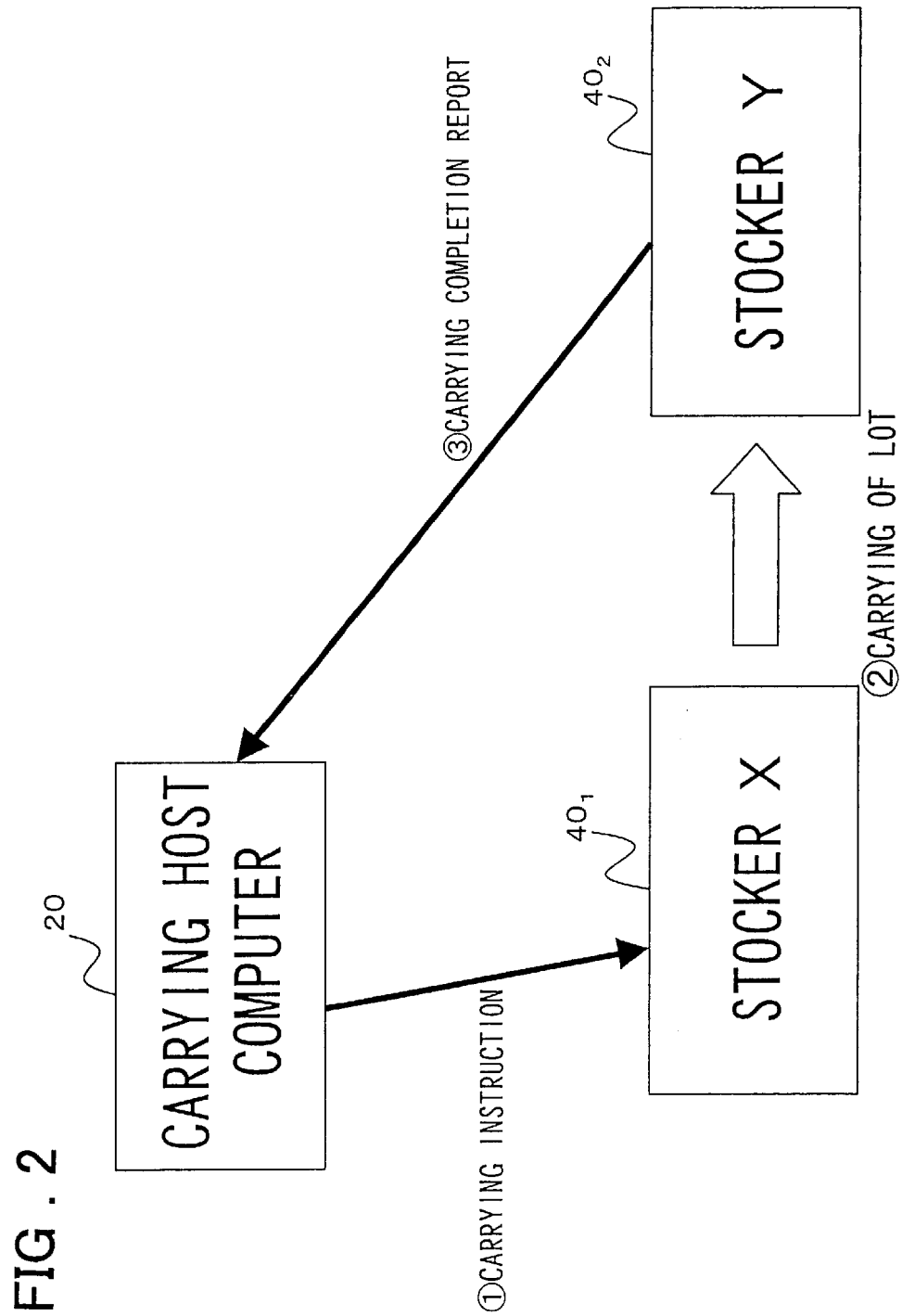
FIG. 2 is a diagram explaining the principle of the operation of one embodiment of the present invention.

FIG. 2 is a diagram explaining the operation principle of one mode of embodying the present invention. In one mode of embodying the present invention, after a carrying host computer (20) has determined an in-process step (a stocker Y ($40_2$) at next step) for the special purpose lot stored by the stocker X ($40_1$) by assuming that the time out of a timer which is started when the special purpose lot (or lots) is received by the stocker X ($40_1$) is the completion of the processing at the step concerned, sends (1) a carrying instruction to the stocker X ($40_1$) which currently stores the special purpose lot (or lots). The stocker X ($40_1$) transports (carries) the special purpose lot to the stocker Y ($40_2$) at next step (2). When the special purpose lot (or lots) is received by the stocker Y ($40_2$), a carrying completion report is transmitted to the carrying host computer (20). Also in the stocker Y ($40_2$) automatic carrying control to a next step is conducted under control of the timer similarly to the stocker X ($40_1$).

The lot (or lots) of wafers which is/are carried for monitoring dust in a clean room is/are used as the special purpose lot (or lots).

The carrying host computer (20) instructs to carry only the special purpose lot (or lots) among the lots stored in the stockers in accordance with a carrying pattern.

In a carrying host computer (20) for controlling automatic carrying of lots among stockers which store a special purpose lot (or lots) comprising wafers which are not processed by semiconductor manufacturing facilities, or a lot (or lots) comprising said special purpose lot(s) and lots comprising wafers which are processed by the semiconductor manufacturing facilities in a carrying system for automatically carrying wafers by interoperation carrying means on and along a path laid among steps on a lot by lot basis, the carrying host computer comprises a storage unit including a storage unit lot table (21) for managing the lots stored in the stockers, a carrying path pattern table for registering carrying patterns comprising a series of steps (referred to as "carrying steps") defining a carrying path or paths of the special purpose lot(s) which will be not processed by production facilities and information on the cycle through the carrying path in a corresponding relationship with a pattern ID (identification information), and a lot path table (23) for storing and managing a lot ID (identification information) of said special purpose lot, the pattern ID and an in-process step in the carrying step in a corresponding manner.

In a preferred mode of embodying the invention, there is a program readable and executable by the host computer (20), which implements the following operations:

(a) determining the purpose of the lot (or lots) in response to a receipt report of the lot (or lots) from one of the stocker when said one of the stockers on said carrying step receives the lot (or lots);

(b) initiating a timer in response to said receipt report of said lot;

(c) acquiring a pattern ID corresponding to said lot ID from the lot ID of said special purpose lot with reference to the lot path table by assuming that the processing at a step to which said stocker belongs has been completed when said timer times out if said lot (or lots) is/are determined as said special purpose lot, followed by acquiring a carrying pattern corresponding to said pattern ID by retrieving in the carrying path pattern table based upon said pattern ID to determine a next step from said carrying pattern; and (d) sending to said one of the stockers which store said special purpose lot (or lots), a carrying instruction to carry said special purpose lot (or lots) to the stocker at a next step.

In this case, the program may be read from a recording medium (any one of FD (floppy disk or disket), MT (magnetic tape), HDD (hard disk drive), CD-ROM, DVD (digital versatile disk) and semiconductor memory and the like) to the carrying host computer (20) by a recording medium reading unit (not shown) included in the carrying host computer (20), or is read to the carrying host computer (20) by downloading it via a network, so that the program is loaded to a main memory. Control processing of the carrying host computer (20) in the present invention is achieved by executing the loaded program.

[Embodiments]

Figure 8:
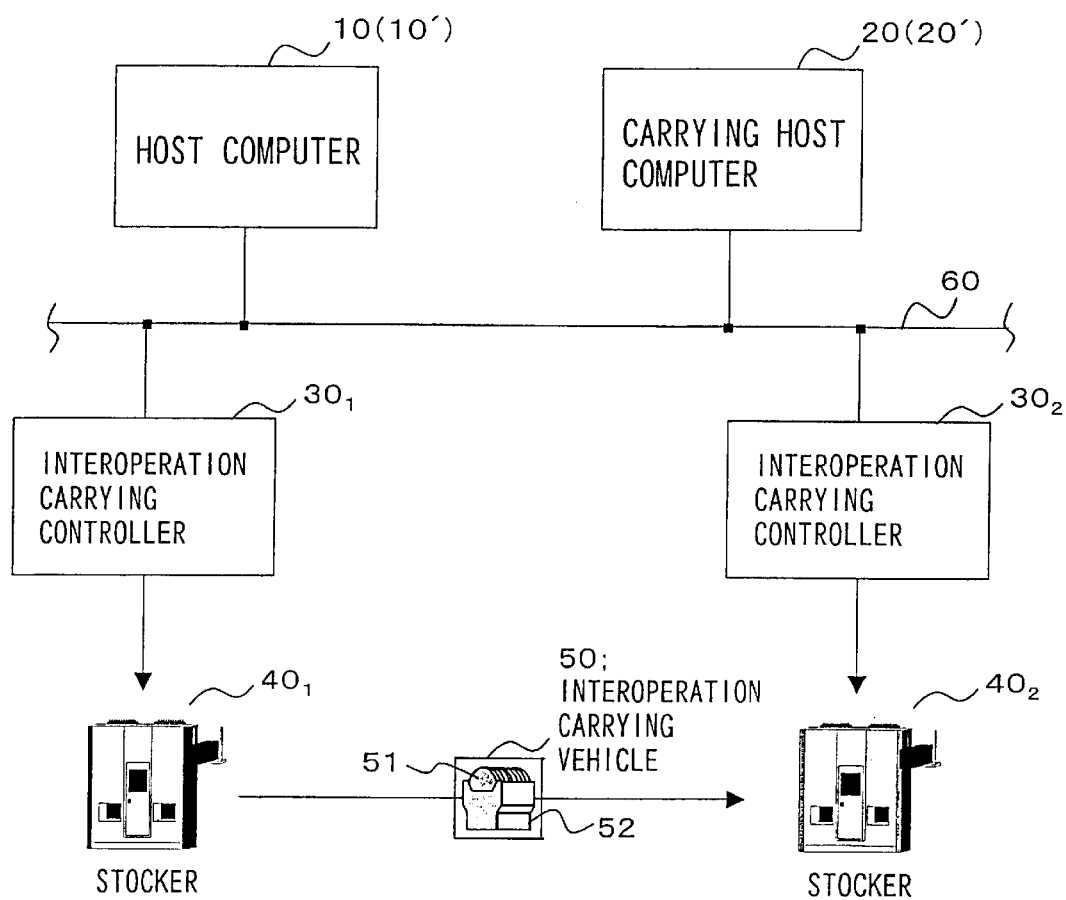
FIG. 8 is a diagram showing a system configuration of one embodiment of the present invention, generally common with prior art.

For further understanding of the above-mentioned modes of embodying the present invention, the embodiments of the present invention will now be described with reference to the drawings. FIG. 8 is a diagram explaining a carrying control system which is one embodiment of the present invention. In FIG. 8, reference numerals 10 and 20 denote a host computer and a carrying host computer in one embodiment of the present invention, respectively. The general outline of the carrying control system per se in one embodiment of the present invention is common to that of the prior art, but the function and configuration of the carrying host computer which is control led in accordance with a program and data base are different from those of the prior art.

Referring now to FIG. 8, the carrying control system comprises a plurality of stockers $40_1$, $40_2$ which are disposed at different areas within a clean room. A path (rail) is laid between the stockers $40_1$, $40_2$. An interoperation (inter-step) carrying vehicle on which a carrier accommodating, for example, one lot of wafers 51 is loaded is carried on and along the path. The stockers $40_1$, $40_2$ each are provided with an interoperation carrying controller $30_1$, $30_2$ for automatically carrying storage unit lots in response to instructions of receiving and sending out of lot(s) and carrying from the carrying host computer 20. Interoperation carrying controllers $30_1$, $30_2$ are connected over a network 60 to the carrying host computer 20 and the host computer which constitutes a production managing system for generally controlling a semiconductor production line.

The host computer 10 is adapted to control the processing conditions of and the process advancement in process of each lot. The carrying host computer 20 is adapted to control the carrying of each lot and to instruct the carrying of each lot to the stockers 40 via the interoperation carrying controller 30.

The stockers 40 are capable of automatically carrying lots which are instructed for carrying by the carrying host computer 20 and store a plurality of lots to be processed. In stockers 40, special purpose lots and product lots are differently disposed. The interoperation carrying vehicle for carrying the carrier which accommodates a wafer lot is driven for carrying by an electromagnetic system on the path (rail).

FIG. 1 is a diagram showing an example of tables which the host computer 10 and the carrying host computer 20 have in one embodiment of the present invention. These tables may be registered and controlled in a storage unit (database) which the host computer 10 and the carrying host computer 20 have, respectively, or may be shared in a common database by the host computer 10 and the carrying host computer 20.

Referring now to FIG. 1, the system comprises a lot table 11 that contains a list of information on the lots which are registered in the host computer 10 as a database which is maintained by the host computer 10. The lot table 11 is registered and controlled by a person who is in charge of maintenance. The lot table 11 mat be in a configuration similar to that in the prior art carrying control system, however, it includes at least a purpose entry which represents the lot ID and whether or not the lot in interest is a product lot or special purpose lot. The other information which is stored in the lot table is omitted in FIG. 1 since it is not directly related with the spirit of the present invention.

The carrying host computer 20 comprises as a database, a storage unit lot table 21, carrying path pattern table 22 and lot path table 23.

Among them, the storage unit lot table 21 is similar to that in the prior art carrying control system and is provided for each stocker which is managed by the carrying host computer 20 and contains a list of information on lots stored in the stockers and is automatically updated at anytime in response to a report from the carrying host computer 20 and contains each lot ID and the purpose of the lot in interest as one entry.

Figure 10:
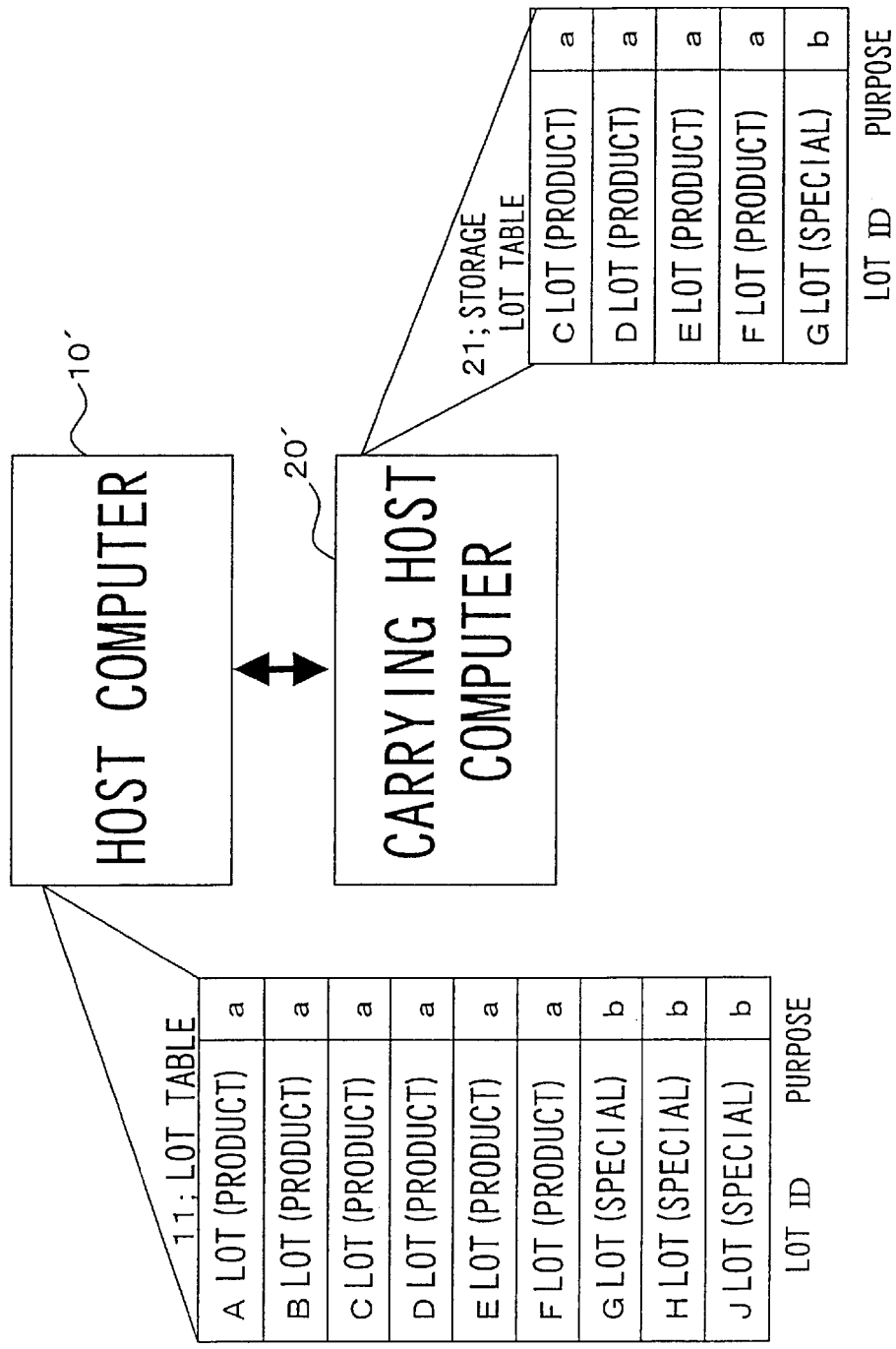
FIG. 10 is a diagram showing an exemplary table configuration of a host computer and a carrying host computer in a prior art system.
Figure 11:
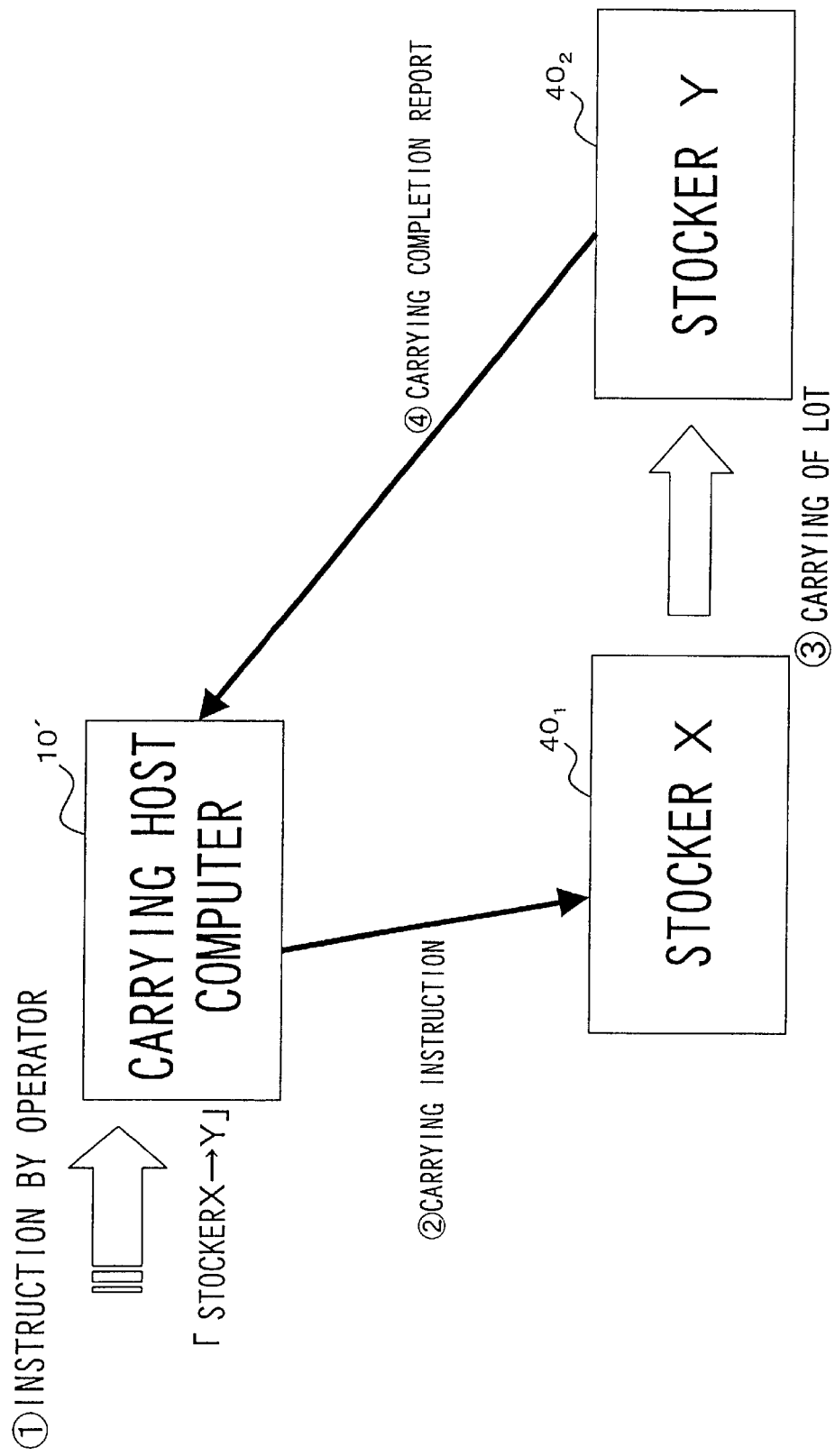
FIG. 11 is a diagram explaining the carrying of a special purpose lot in a prior art carrying control system.
Figure 12:
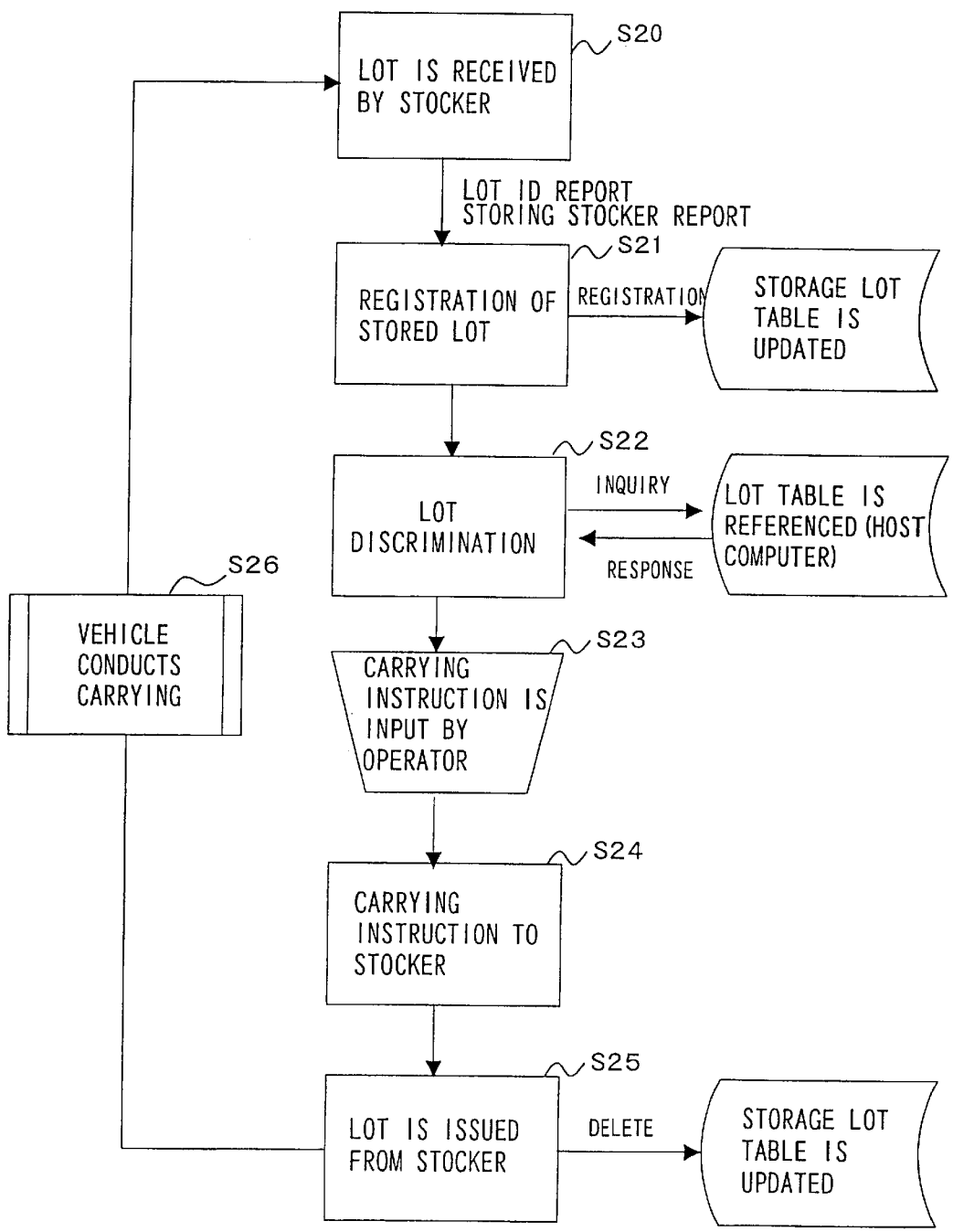
FIG. 12 is a flow chart showing a process for carrying special purpose lots in the prior art carrying control system.

In one embodiment of the present invention, a carrying path pattern table 23 and lot path table 22 are added to the prior art table arrangement which is shown in FIG. 10.

The carrying path pattern table 22 is a table for registering the steps for carrying the special purpose lots in the order of steps and its registration is achieved by an operator.

The carrying path pattern table 23 contains each one entry of the pattern ID, the field (the field length of which may be variable) including information of path of the pattern (order of carrying path), and the number of cycles.

In the example of FIG. 1, a pattern a represents a carrying pattern in which the interoperation carrying path comprises steps 1, 2, 3, etc. and the special purpose lot is carried in the order of the stocker at step 1, the stocker at step 2 and the stocker at step 3, etc. A pattern β represents a pattern in which the interoperation carrying path comprises steps 4, 5, 6, etc. and the special purpose lot is carried in the order of stocker at starting step 4, stocker at step 5, stocker at step 6, etc.

Figure 9:
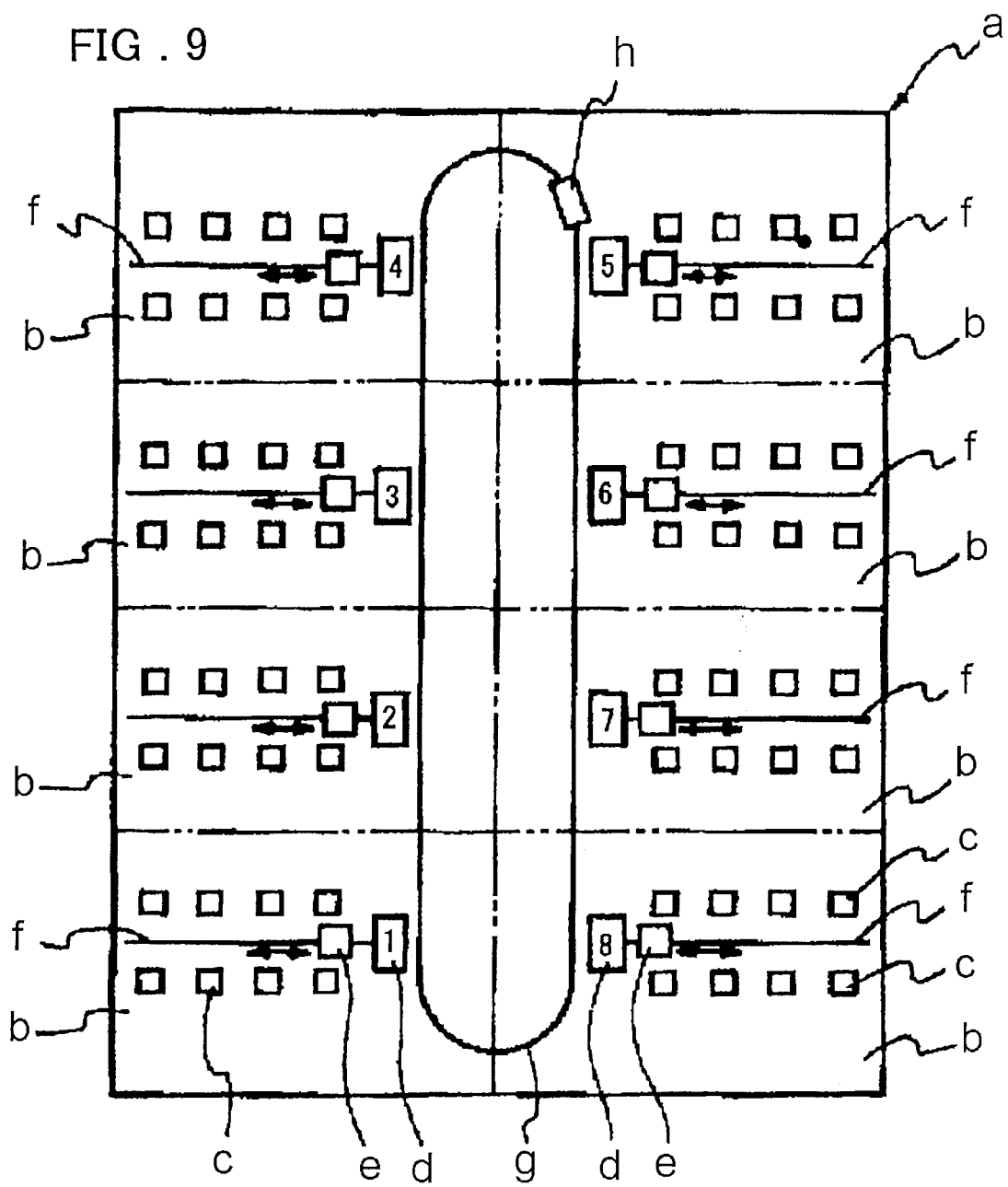
FIG. 9 is a diagram schematically showing a layout of a semiconductor production line and a carrying system, generally common with prior art.

At the entry of the number of cycles in the carrying path pattern table 22, the number of cycles between steps is preset. In case where the pattern γ comprises steps 6, 2, 4, . . . and the number of the cycles is 3 and the stocker 6 at step 6 is a starting stocker in FIG. 9, the lot is cycled 3 times through the process of the stockers 6, 2, 4, . . . 6, until the carrying is completed.

The contents of the carrying path pattern table 22 are input and updated by a managing personal, etc.

The lot path table 23 is a table for registering the special purpose lots therein. Its registration is conducted by the operator. It contains each entry of the lot (special purpose lot) ID, the path pattern corresponding to the lot ID and the in-process field. The in-process field is automatically updated into the step (stocker) of the next carrying destination by the carrying host computer 20 per each advance in the carrying between the steps. As will be described hereafter, the special purpose lot is advanced to the next step by starting a timer in the carrying host computer 20 on receipt at the stocker and by assuming that the process has been completed upon time-out.

Now, a process sequence in one embodiment of the present invention will be described.

Figure 3:
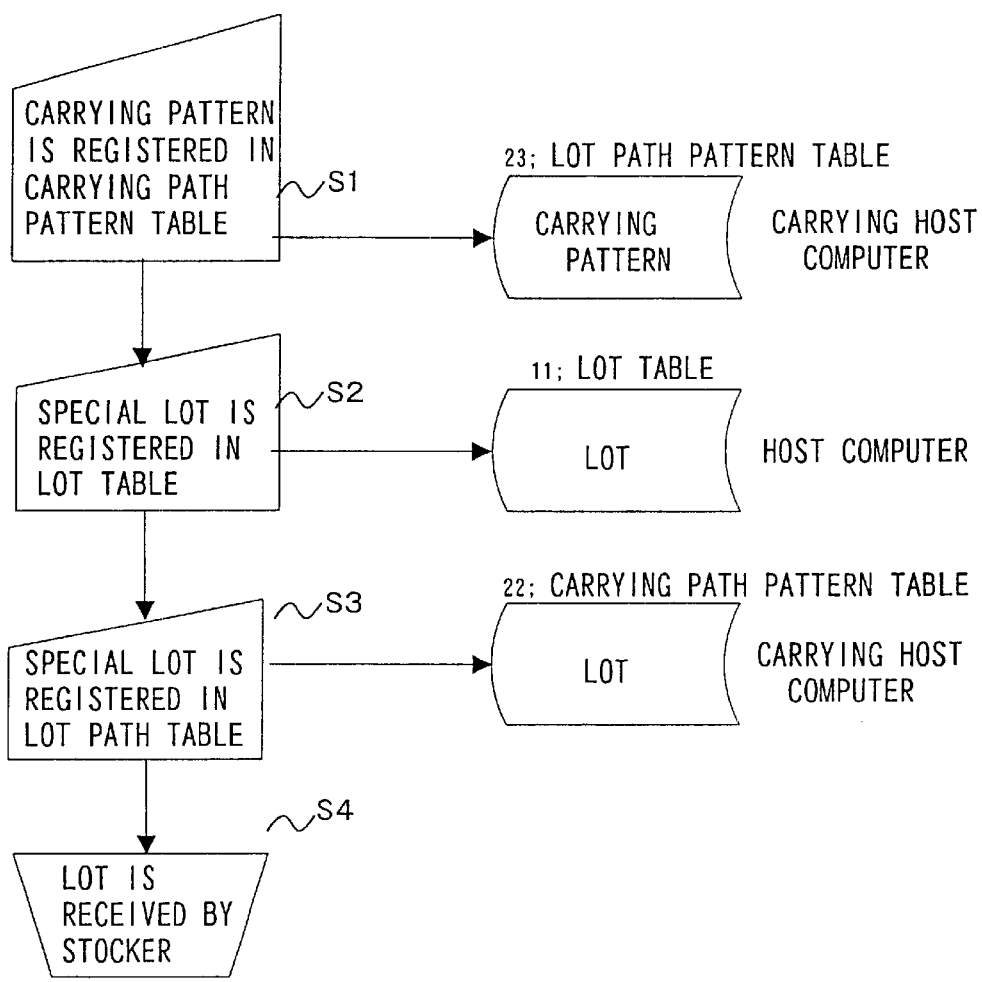
FIG. 3 is a flow chart showing the process of one embodiment of the present invention.

FIG. 3 is a flow chart showing a process sequence in one embodiment of the present invention. A process for the registration of the special purpose lot in the database in one embodiment of the present invention will be described with reference to FIG. 3.

A pattern of carrying a special purpose lot (comprising a pattern ID for defining the carrying pattern, a pattern including step sequence defining the carrying path and the number of cycles) is registered in the carrying path pattern table 22 of the carrying host computer 20 (step S1). The number of cycles is preset to zero if the carrying path will not be cycled through the line.

The special lot is registered in the lot table 11 of the host computer 10 (step S2).

The lot ID of the special purpose lot is registered in the lot path table 23 and the pattern ID which specifies the carrying pattern of the special purpose lot in interest is registered in the lot path table 23 so that it corresponds to the lot ID (step S3).

The special purpose lot is received in the stocker which is a starting point (step S4). At this time, the reception of the lot into the stocker which is a starting point is usually manually conducted.

Figure 4:
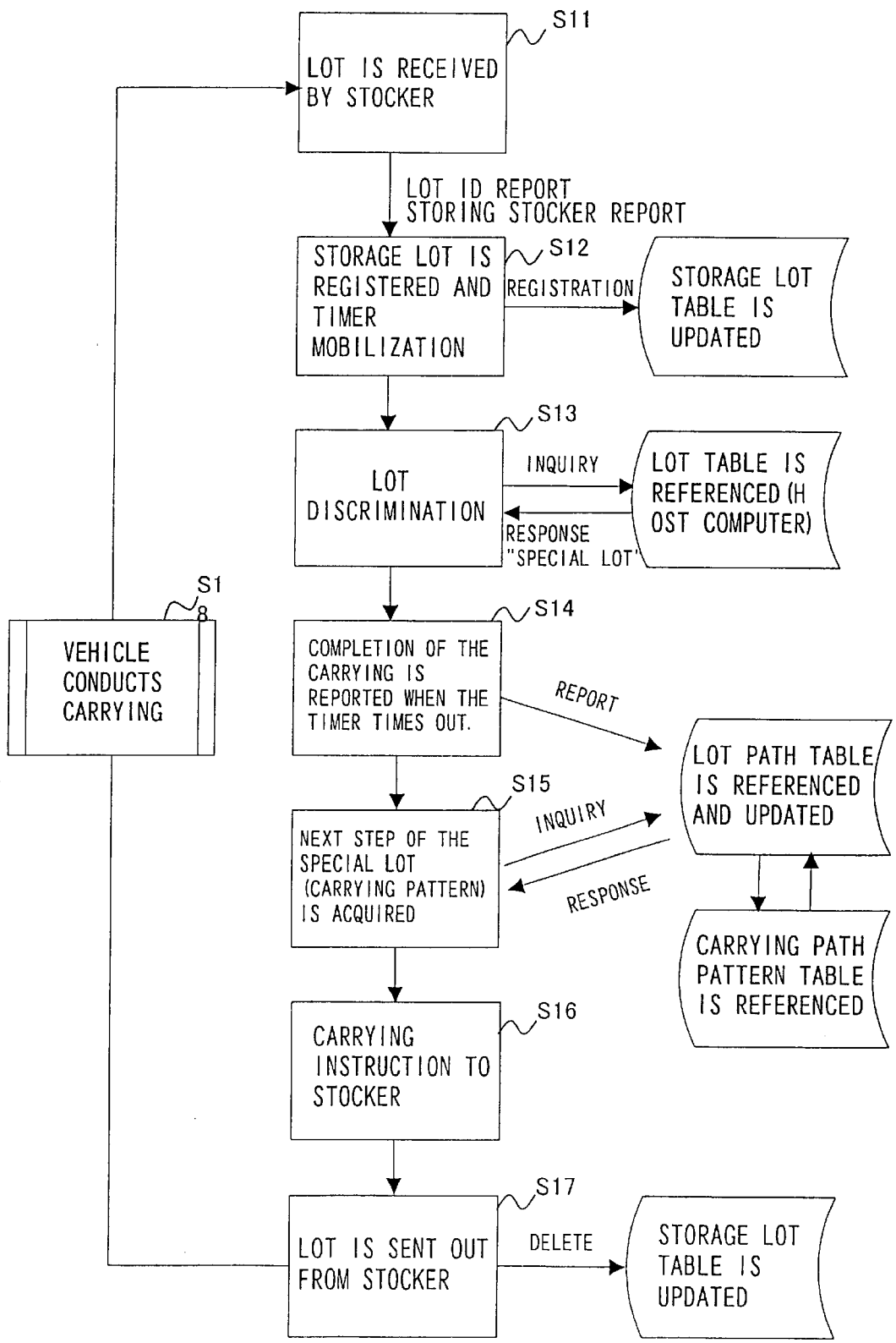
FIG. 4 is a flow chart showing the process of one embodiment of the present invention.

FIG. 4 is a flow chart showing a process sequence in the carrying host computer in one embodiment of the present invention. The process for carrying the special purpose lot in one embodiment of the present invention will be described with reference to FIG. 4.

When a special purpose lot is received at (i.e. placed on) the stocker 40 (step S11), a message is transmitted from the stocker 40 to the carrying host computer 20, reporting the lot ID of the received lot. The lot ID and the purpose of the lot in interest (the products and the special purpose lots are designated by "a" and "b", respectively) is registered in the storage unit lot table corresponding to the stocker which has received the lot.

Acquiring the lot ID of the received lot when received at the stocker will be explained. In the stocker 40, identification information which is marked on the received carrier (comprising bar code etc.) is read by means of a reader such as a bar code reader so that the identification information of the carrier is transmitted to the host computer 10. The host computer 10 recognizes the lot ID of the lot which has been received by the stocker based upon the corresponding relation between the identification information of the carrier and the lot ID of the lot accommodated in said carrier. The stocker which has received the lot can be identified by a network address and the like added to a reception informing message which is transmitted from the stocker to the carrying host computer 20.

The timer is started simultaneously with the registration of the lot into the storage unit lot table 21 in the carrying host computer 20 (step S12). The timer is adapted to automatically generate an event such as completion of processing after the receiving of the special purpose lot at the stocker 40.

The carrying host computer 20 recognizes (discriminates) the purpose of the lot based upon the lot ID of the lot received by the stocker 40 from the host computer 10 (step S13).

If the purpose of the lot is of a special purpose, it is assumed in the carrying host computer 20 that the completion of the carrying is reported when the timer times out (step S14). The carrying pattern ID which is registered for the lot in interest is acquired from the lot ID of the special purpose lot with reference to the lot path table 23. The carrying pattern corresponding to the carrying pattern ID is acquired by retrieving the carrying path pattern table 22 based upon the acquired carrying pattern ID. Next step of the current process (next stocker) is determined from the acquired carrying pattern (step S15). If no next step exists in the carrying pattern read from the carrying path pattern table 22 and the number of cycles is zero, the current stocker would be a final stocker. If no next step exists in the carrying pattern and the number of the cycles is one or more, the next step would be the stocker at the original position.

When next step is determined, the carrying host computer 20 instructs the stocker which stores the special lot to carry it to the next stocker (step S16).

The interoperation carrying controller 30 of the stocker 40 causes the lot to unload (be sent out) in response to the carrying instruction from the carrying host computer 20 (step S17). The lot is carried by the interoperation carrying vehicle (step S18) and is received by the next stocker.

The process from the above-mentioned step S11 to step S18 is repeated until it reaches the final step of the carrying path pattern table 22, whereupon it is stored in the stocker at its own step.

If the special purpose lot having a carrying pattern stored in the carrying path pattern table 22, which has been carried, is a lot for monitoring dust, it is unloaded from the final stocker and is recovered for carrying it to a dust measuring instrument (not shown), in which the dust adhered to wafers is measured. A result of measurement acquired by the dust measuring instrument may be registered in the database as the production managing data of the product lot stored in the stocker when the special purpose lot is carried.

Figure 5A:
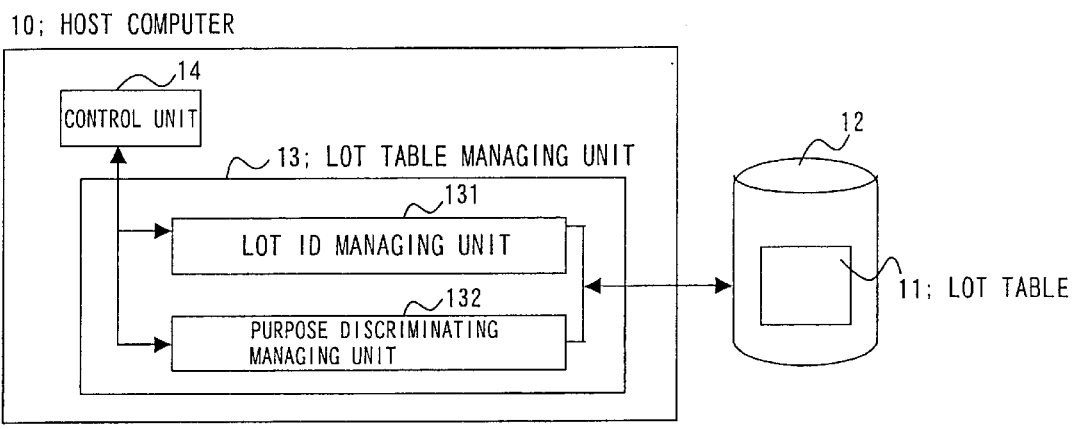
FIGS. 5(a) and 5(b) are diagrams showing the configuration of a host computer and a carrying host computer of one embodiment of the present invention.
Figure 5B:
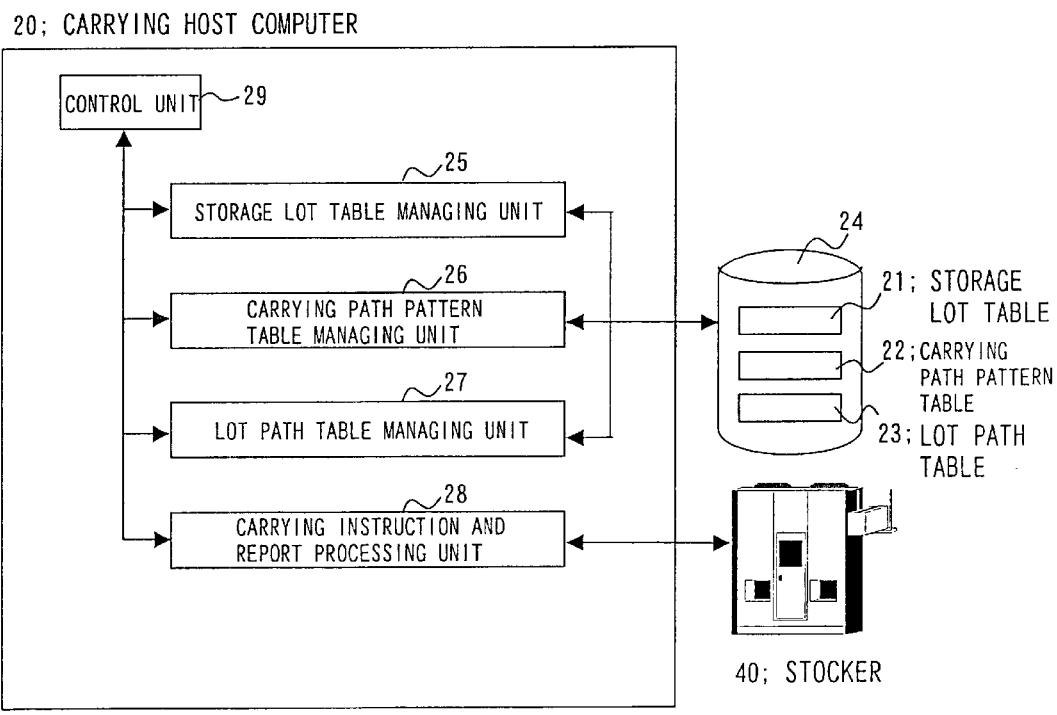

The configuration of one embodiment of the present invention which implements the above-mentioned functions will now be described. FIGS. 5(a) and 5(b) are diagrams showing the configuration of the host computer 10 and the carrying host computer 20 in one embodiment of the present invention, respectively. Referring now to FIG. 5(a), a host computer 10 comprises a lot table managing unit 13 for managing the lost table 11 stored in a storage unit (file device) 12. A lot table managing unit 13 comprises a lot ID managing unit 131 and a purpose discriminating (or classifying) managing unit 132.

The lot ID managing unit 131 is adapted to perform the registration and retrieval of the lot ID in the lot table 11. The purpose discriminating managing unit 132 is adapted to perform the registration of the purpose of the lot ID in interest as well as its retrieval in response to the inquiry of the purpose, etc. from the carrying host computer 20.

Referring to FIG. 5(b), the carrying host computer 20 comprises a storage unit lot table managing unit 25, carrying path pattern table managing unit 26, lot path table managing unit 27 and carrying instruction and report processing unit 28.

Figure 6A:
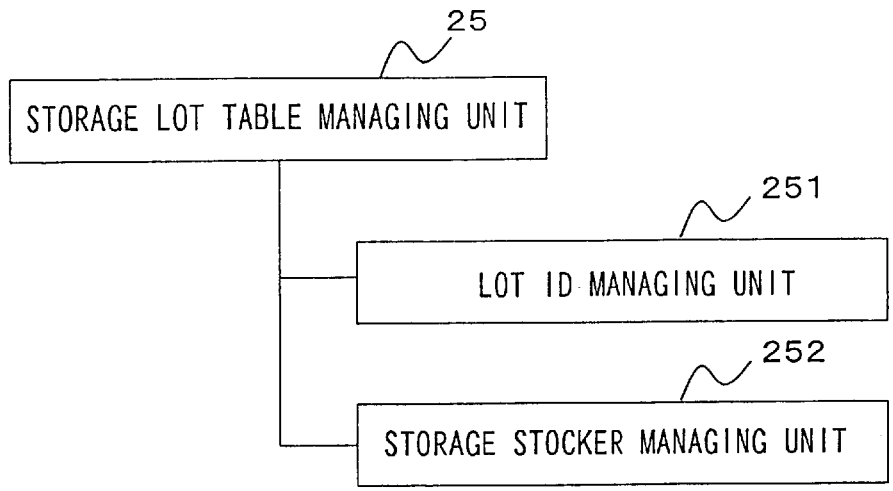
FIGS. 6(a) and 6(b) are diagrams showing the configuration of a carrying host computer of one embodiment of the present invention.

The configuration of each unit of the carrying host computer 20 will be described with reference to FIGS. 6 and 7. Referring now to FIG. 6(a), the storage unit lot table managing unit 25 comprises a storage unit stocker managing unit 252 which manages the stockers for accommodating lots, and a lot ID managing unit 251 which manages the registration and deletion of the lot ID and entry of the purpose discrimination to/from the storage unit lot table 21. The lot ID managing unit 251 is adapted to obtain the lot ID or the purpose of the lot ID in interest based upon the information reported from the stocker 40 when the lot is received into the stocker 40.

Figure 6B:
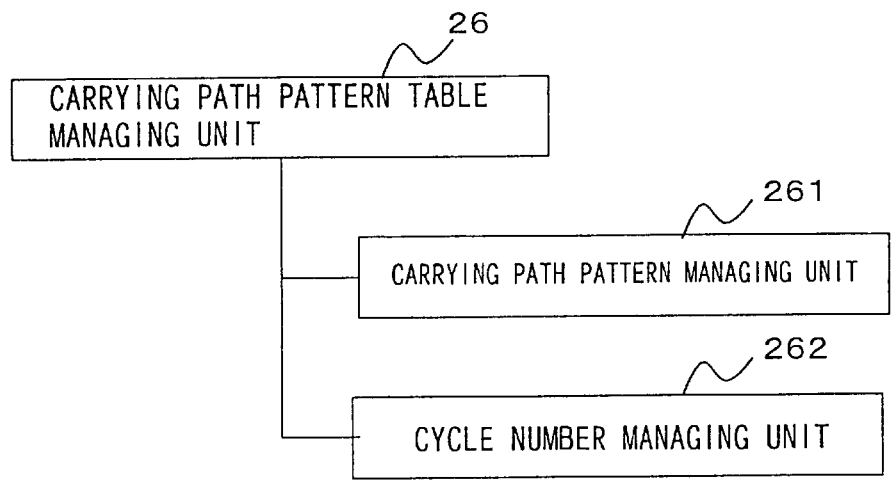

Referring now to FIG. 6(b), the carrying path pattern table managing unit 26 comprises a carrying path pattern managing unit 261 for registering the correspondence between the terminal pattern ID input from an operation terminal, etc. of the carrying host computer 20 and the step order pattern defining the carrying path (or paths) in the carrying path pattern table 22 and a cycle number managing unit 262 for managing the information on the number of cycles in the carrying path pattern table 22.

Referring now to FIG. 7(a), the lot path table managing unit 27 comprises a lot ID managing unit 271 for managing the registration of the lot ID in the lot path table 23, a carrying pattern ID managing unit 272 for managing the registration of the carrying pattern and an in-process managing unit 273 for managing the in-process.

The in-process managing unit 273 manages the update of the in-process in the lot path table 3.

On time-out of the timer, the carrying process pattern which is registered in the carrying path pattern table 22 is acquired from the lot ID of the special purpose lot input to the stocker via the carrying path pattern table managing unit 26, so that the next step is acquired by acquiring a step which is advanced by one step from the step of the stocker into which the special purpose lot is currently input.

Referring now to FIG. 7(b), a carrying instruction and report processing unit 28 comprises a carrying instruction processing unit 281 which issues an instruction of carrying to the in-process carrying controller 30 to the stocker 40 a carrying report processing unit 282 which receives a report on carrying from the in-process carrying controller 30 when the special lot is received at the stocker 40, a purpose discriminating unit 283 for discriminating the purpose of the lot in interest when the lot is received at the stocker 40, a step changing unit 284 for changing the in-process step of the lot path table 23, a timer managing unit 285 for managing the control of initiating and time-out of the timer, and an abnormality detecting unit 286 for outputting a signal which an alarm output or outputs the carrying processing when the abnormality of carrying is detected.

In accordance with an embodiment of the present invention, a timer table for managing the time-out may be provided for each stocker in the carrying host computer 20. When the lot is received by the stocker, a predetermined value is in a timer table corresponding to the stocker in interest so that the count is reset to a starting state. The value of the timer table is decremented by the interruption of every given unit time, such as line clock. The timer may be control led by a software in which time-out occurs when the value becomes zero.

The abnormality detecting unit 286 outputs an alarm or temporarily stops the in-process carrying underway conducted by the in-process carrying vehicle if a fault (abnormality of carrying) in which the lot is not received by the second stocker even if a predetermined period of time has passed since the unloading (dispatching) from the first stocker in the course of in-process carrying of the lot between one stocker and the other stocker.

Each unit of the host computer 10 and the carrying host computer 20 has its processing and functions which are implemented by a program or programs which are executed by the host computer 10 and the carrying host computer 20, respectively. In this case, the processing and functions of each of the above-mentioned units can be implemented by reading the programs from a recording medium which records the programs thereon to a computer and loading them in a main storage unit (or memory).

The configuration of the carrying host computer 20 which is shown in FIGS. 5 to 7 illustrates only an exemplary functional configuration. The module configuration of the control program is not limited to that shown in FIGS. 6 and 7.

Although wafer lots used for monitoring dust in a clean room have been exemplarily described as a special purpose lot which is not treated by a semiconductor producing facility in a process, the special purpose is not limited to that used for monitoring dust in accordance with the present invention. The lot may be the other monitoring lot used for checking vibrations by running the interoperation carrying vehicle which carries a carrier accommodating a wafer lot.

The special purpose is not limited to only one purpose, in accordance with the present invent ion. The present invention is applicable to an arrangement in which wafer lots having plural special purposes are carried on and along the in-process carrying path or paths.

Although the foregoing embodiment is contemplated to carry the special purpose lot exclusively among the steps, it may of course be configured to carry the lot partly through the steps by means of a interoperation carrying robot (represented at e in FIG. 9) after it is received by the stocker and to receive again by the stocker without being treated by the production facility and to dispatch and carry it for next step. In such a configuration, the dust monitoring lot may be automatically carried in a mode similar to the product lot carrying mode so that the cleanness (dust) in the interoperation carrying facility, stockers and carrying facility can be monitored effectively.

The configurations which have been described in the fore-going embodiments and shown in the drawings, exemplarily illustrate the present invention and are not contemplated to restrict the present invention. Various modifications and alternations can be made by those skilled in the art without departing from spirit and scope of the invention.

The meritorious effects of the present invent ion are summarized as follows.

As mentioned above, the present invention provides advantages as follows:

A first advantage of the present invention resides in that the number of working steps can be remarkably reduced, resulting in an improvement in the working efficiency in comparison with the prior art carrying control system in which a carrying instruction is preset and input from a terminal by an operator at each step, since automation of carrying of a special purpose lot between stockers is achieved by outputting a carrying instruction for a next step after the carrying process is advanced to the next step in response to a report of completion of the carrying of the special lot.

A second advantage of the present invention resides in that it is not necessary for the database of the host computer to store and manage the information on the completion of the interoperation carrying and necessity of registration and management of a number of wasteful steps for usual production lots is omitted, so that effective utilization of the storage unit area can be achieved. The reason is that a timer is started when a special purpose lot is received by the stocker and it has been assumed that the processing of the special purpose lot has been completed when the timer times out, so that the next step of the special purpose lot is determined to issue a carrying instruction. The system is configured to interpret a report of the carrying completion from the stocker as a completion of the interoperation (inter-step) carrying so that the host computer will not control the registration and management of carrying steps.

A third advantage of the present invention resides in that automation of carrying of special purpose lots between stockers is achieved, resulting in that misoperation can be prevented, the storage unit conditions of the product lots can be made completely same as those of the special purpose lots and the accuracy of the dust monitoring can be enhanced. The reason is that the carrying host computer includes means for managing the carrying pattern for the special lots and in-process steps so that usual product lots and the special purpose lots can be stored in stockers in the same manner.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A carrying control system, wherein a carrying pattern defining a carrying path for each of special purpose lots comprising wafers which will not be processed in production facilities is preliminarily stored in a storage unit which is accessed from a carrying host computer which manages the control of carrying facility, wherein said carrying host computer, which receives a report of the completion of carrying relating to said special purpose lot or lots from one of stockers when said special purpose lot or lots are received by said one of the stockers, is adapted to advance the carrying step of said special purpose lot or lots and in accordance with a carrying pattern to determine a next stocker corresponding to said special purpose with reference to said storage unit so that it sends an instruction to carry said special purpose lot or lots to said one of the stockers, and wherein said special purpose lot or lots are automatically carried from a stocker constituting a starting point of said carrying pattern which is preliminarily defined for said special purpose lot or lots to a stocker constituting a final point of said carrying pattern.

2. A carrying control system comprising:

stockers for storing therein special purpose lots comprising wafers which will not be processed in production facilities, or said special purpose lots and usual lots comprising wafers which will be processed by production facilities, and a carrying host computer for controlling automatic carrying of lots in carrying facilities, wherein said carrying host computer comprises:

a storage unit for registering carrying patterns which define a carrying path or paths for special purpose lots; and means which receives a report of receipt of said special purpose lot or lots by said one of stockers transmitted from said one of the stockers when said special purpose lot or lots are received by said one of the stocker in said carrying pattern, for initiating a counting means and for assuming that processing of said special purpose lot or lots stored in said stocker are completed when a result of count in said counting means shows the lapse of a predetermined period of time, for determining next stocker to which said special purpose lot or lots are to be carried next in accordance with said carrying pattern corresponding to said special purpose lot or lots stored in said storage unit, and for sending to said one of the stockers which stores said special purpose lot or lots a carrying instruction for carrying special purpose lot or lots to a next stocker.

3. A carrying control system comprising:

stockers each for one step for storing lots of wafers which are put into production facilities in a production process and special purpose lots of wafers, which are automatically carried between steps by interoperation carrying means without being put into the production facilities in a process, and a carrying host computer for controlling the carrying of lots in carrying facilities, wherein said host computer comprises:

a storage unit for preliminarily storing carrying patterns each comprising a series of steps defining a carrying path for each of said special purpose wafer lots, and means which receives a report of the receipt of a lot or lots from said stocker to start a timer, said means assuming that processing of said special purpose lot or lots which will not be put into the production facilities in a process is completed in a step corresponding to said stocker when said timer times out, for determining a step to which said special purpose lot or lots to be carried next in accordance with said carrying pattern corresponding to said special purpose to be stored in said storage, and for sending a carrying instruction to carry said special purpose lot or lots to said next step.

4. A carrying control system for automatically carrying wafers on a lot by lot basis on carrying facilities laid between/across steps by means of interoperation carrying means, wherein a carrying host computer for controlling the carrying of lots in said carrying facility comprises:

a storage unit having a carrying path pattern table for registering carrying patterns comprising a series of steps defining the carrying paths (referred to as "carrying steps") of the special purpose lot or lots which will not be processed in the production facilities and pattern identification information IDs in a corresponding relationship thereto in addition to a storage lot table for managing the lot or lots stored in the stocker at said each step and a lot path table for storing and managing the correspondence between the lot identification information IDs of said special purpose lot or lots and the pattern ID, and the in-process step at said carrying step;

means for initiating a timer and determining the purpose of said lot or lots in response to a report of reception of said lot or lots from one of the stockers when the lot or lots are received by said one of the stockers in said carrying step;

means which assumes that processing of the lot or lots in the step to which said stocker belongs is completed when said timer times out if a result of said determination shows that the lot or lots have a special purpose and acquires a pattern ID or IDs corresponding to the lot or lots ID or IDs from the lot ID or IDs of said special purpose lot or lots with reference to said lot or lots path table, acquires a carrying pattern corresponding to said pattern ID or IDs by retrieving said carrying path pattern table based upon said pattern ID or IDs for determining a next step as an in-process step if the next step exists in said carrying pattern; and means for sending a carrying instruction to said one of the stockers which store said special purpose lot or lots to issue and carry said special purpose lot or lots to the stocker in said in-process step;

said stocker storing said special purpose lot or lots being adapted to receive the carrying instruction from said carrying host computer to issue said special purpose lot or lots, so that said special purpose lot or lots are automatically carried on a path to the stocker at the next step.

5. A carrying system in semiconductor carrying facilities comprising:

interoperation carrying means for automatically carrying wafers on a lot by lot basis in interoperation carrying facilities, stockers, at least one for each step, for storing the lots and for controlling receiving, sending out and carrying of the lots based upon an input carrying instruction;

a carrying host computer for controlling carrying of each lot and for supplying a carrying instruction to each of the stockers;

a host computer for controlling semiconductor manufacturing, which manages processing conditions and advance of each lot and includes a list of lots, said host computer and said carrying host computer being connected to each other via a network, said stockers being connected to said network via an interoperation carrying controller which controls the carrying between processing steps, wherein said carrying host computer comprises a storage unit comprising:

a storage lot table for storing and controlling the lots stored in said each stocker, a carrying path pattern table for registering carrying patterns comprising a series of processing steps, referred to as "carrying steps", defining a carrying path or paths of a special purpose lot or lots which will not processed by production a facilities and information on a cycle through the carrying path or paths in a corresponding relationship with a pattern identification information ID, and a lot path table for storing and managing lot identification information ID of said special purpose lot, the pattern ID and in-process step in said carrying step in a corresponding manner, a storage lot table managing unit for managing said storage lot table;

a carrying path pattern table managing unit for managing registration, retrieval and update of data on said carrying path pattern table;

a lot path table managing unit for managing registration, retrieval and update of data on said lot path table;

a carrying report processing unit which receives a carrying report from said stocker via said interoperation carrying controller;

a carrying instruction processing unit for transmitting a carrying instruction to said stocker via said interoperation carrying controller;

a lot purpose discriminating unit for discriminating the purpose of the lot or lots received by said stocker;

process changing unit for controlling the change in in-process step in said lot path table;

a carrying instruction and report managing unit having a timer and timer controlling unit for controlling said timer; and a general control unit for controlling the whole of the system; and wherein when said special purpose lot or lots are received by one of the stockers in said carrying step said carrying host computer notifies said control unit of the receipt report from said stocker via said carrying report processing unit, and the timer is started by said timer controlling unit;

wherein reception of said lot by said stocker is registered into the storage lot table corresponding to said stocker in said storage lot table managing unit under control of said general control unit;

wherein the purpose of said received lot is acquired by inquiring said host computer in said purpose discriminating unit;

wherein said timer controlling unit notifies of a report of the completion of a step corresponding to said stocker when said timer times out if the said received lot or lots have a special purpose;

wherein in response to said notification of said step completion report, said step changing unit acquires the pattern ID of the carrying pattern corresponding to the lot ID of said special purpose lot or lots stored in said stocker via said lot path table managing unit and acquires said carrying pattern corresponding to said pattern ID from said carrying path pattern table via said carrying path pattern table managing unit to acquire a next step to the step at which said completion report is received for changing the in-process step corresponding to said lot ID in said lot path table into said next step via said lot path table managing unit;

wherein an instruction to carry to said next step is supplied to the stocker which stores said special purpose lot or lots in said carrying instruction processing unit;

wherein the stocker which has received said carrying instruction sending out said special purpose lot or lots and when a notification of sending-out from said stocker is notified from said carrying instruction report processing unit of said carrying host computer, said sent-out lot or lots which are registered in said storage lot table corresponding to said stocker is updated to a sent-out state in said stored lot table managing unit.

6. A carrying control system as defined in claim 5 wherein said carrying control system comprises a unit for detecting and processing an abnormality which outputs an alarm signal or terminates carrying operation of the interoperation carrying means when it detects the abnormality in carrying of said lot or lots.

7. A carrying control system as defined in claim 5 wherein said special purpose lot or lots are cycled a number of cycles through a carrying path or paths defined between an initial step and a final step based upon the information of the number of cycles in said carrying path pattern table.

8. A carrying control system as defined in claim 1, wherein said special purpose lot or lots are a lot or lots used for monitoring dust adhered to wafers.

9. A process for controlling the carrying of special purpose lots, wherein said process comprises the steps of:

preliminarily storing data on a carrying path for each of special purpose lots comprising wafers which will not be processed in production facilities in a storage unit which is accessed from a carrying host computer which manages control of carrying facilities, receiving a report of completion of carrying relating to said special purpose lot or lots from one of stockers when said special purpose lot or lots are received by said one of the stockers, and determining a next stocker, by said carrying host computer based on a timer count result upon lapse of a predetermined period of time after said special purpose lot or lots have been received by said one of stockers in accordance with a carrying pattern corresponding to said special purpose with reference to said stored data followed by sending an instruction to carry said special purpose lot or lots to said one of the stockers, and automatically carrying special purpose lot or lots from a stocker constituting an starting point of said carrying pattern which is preliminarily defined for said special purpose lot or lots to a stocker constituting a final point of said carrying pattern.

10. A process for controlling carrying of special purpose lots as defined in claim 9, wherein said special purpose lot or lots are a wafer lot or lots used for monitoring dust adhered to wafers.

11. A carrying control process for automatically carrying wafers on a lot by lot basis along a path laid between processing steps by means of an interoperation carrying apparatus, wherein a carrying host computer for controlling the carrying of said carrying system comprises:

a storage unit having a carrying path pattern table for registering carrying patterns comprising a series of processing steps defining carrying a path or paths, referred to as "carrying steps", of a special purpose lot or lots which will not be processed in production facilities and pattern identification information IDs in a corresponding relationship thereto, and a lot path table for storing and managing the correspondence between the lot identification information IDs of said special purpose lot or lots and the pattern IDs, and an in-process step in said carrying steps;

wherein a timer is initiated and the purpose of said lot or lots is determined in response to a report of reception of said lot or lots from one of the stockers when the lot or lots are received by said one of the stockers in said carrying step;

wherein it is assumed that processing of the lot or lots in the step to which said stocker belongs is completed when said timer times out if a result of said determination shows that the lot or lots have a special purpose and a pattern ID corresponding to the lot ID from the lot ID is acquired of said special purpose lot with reference to said lot path table, a carrying pattern corresponding to said pattern ID is acquired by retrieving said carrying path pattern table based upon said pattern ID for determining a next step as an in-process step if the next step exists in said carrying pattern; and wherein a carrying instruction is sent to said one of the stockers which store said special purpose lot or lots to send out and carry said special purpose lot or lots to the stocker in said in-process step; and wherein said stocker storing said special purpose lot or lots is adapted to receive a carrying instruction from said carrying host computer to send out said special purpose lot or lots, so that said special purpose lot or lots are automatically carried along a path to the stocker at the next step.

12. A carrying control apparatus for controlling automatic carrying of lot or lots among stockers which store special purpose lot or lots comprising wafers which are not processed in production facilities or lot or lots comprising said special purpose lot or lots and lot or lots of wafers which are processed in production facilities, wherein said apparatus comprises:

means for initiating a timer in response to a report of receipt of the special purpose lot or lots which are received by one of the stockers when said one of the stockers receives the special purpose lot or lots;

means for determining a next step to which said special purpose lot or lots are to be carried in accordance with a carrying pattern corresponding to said special purpose lot or lots, stored in a storage unit by assuming that processing of said special purpose lot or lots among lots received by said stocker is completed based upon a result of counting in said timer when a predetermined period of time has lapsed since said special purpose lot or lots are received by said one of the stockers; and means for supplying to the stocker which stores said special purpose lot or lots a carrying instruction to carry said special purpose lot or lots to said determined next step.

13. In a carrying control apparatus for controlling automatic carrying of lot or lots among stockers which store special purpose lot or lots comprising wafers which are not processed in production facilities or lot or lots comprising said special purpose lot or lots and a lot or lots of wafers which are processed in production facilities, a computer readable program product to cause a computer making up said carrying control apparatus to execute the operations of:

(a) initiating a timer in response to a report of receipt of a special purpose lot or lots received by one of the stockers when said one of the stockers receives the special purpose lot or lots;

(b) determining a next processing step to which said special purpose lot or lots are to be carried in accordance with a carrying pattern corresponding to said special purpose lot or lots, stored in a storage unit by assuming that processing of said special purpose lot or lots among the lots received by said stocker is completed based upon a result of counting in said timer when a predetermined period of time has lapsed since said special purpose lot or lots have received by said one of the stockers; and (c) supplying to a stocker which stores said special purpose lot or lots a carrying instruction to carry said special purpose lot or lots to said determined next step.

14. In use for a carrying control apparatus for controlling automatic carrying of lot or lots among stockers which store a special purpose lot or lots comprising wafers which are not processed by semiconductor manufacturing facilities, or lot or lots comprising said special purpose lot or lots and lot or lots comprising wafers which are processed by the semiconductor manufacturing facilities in a carrying system for automatically carrying wafers by an interoperation carrying apparatus on and along a path or paths laid among steps on a lot or lots by lot or lots basis, said carrying host computer comprising a storage unit including:

a carrying path pattern table for registering carrying patterns comprising a series of processing steps referred to as "carrying steps", defining a carrying path or paths of a special purpose lot or lots which will not processed by production facilities and information on the cycle through a carrying path or paths in a corresponding relationship with a pattern identification information ID, and a lot path table for storing and managing the correspondence between a lot identification information ID of said special purpose lot or lots and, the pattern ID, and an in-process step in said carrying steps, a computer readable program product to cause a computer making up said carrying control apparatus to execute the operations of:

(a) initiating a timer in response to a receipt report of said lot or lots from one of said stocker when said one of the stockers on said carrying step receives the lot or lots;

(b) determining the purpose of said lot or lots in response to said receipt report thereof;

(c) acquiring a pattern ID corresponding to said lot ID from the lot ID of said special purpose lot or lots with reference to said lot or lots path table by assuming that processing at a step to which said stocker belongs is completed when said timer times out if said lot or lots are determined as said special purpose lot or lots and acquiring a carrying pattern corresponding to said pattern ID by retrieving said carrying path pattern table based upon said pattern ID to determine a next step from said carrying pattern; and (d) supplying to said one of the stockers which store said special purpose lot, a carrying instruction to carry said special purpose lot or lots to a stocker at the next step.

* * * * *